（12）United States Patent
Li et al.

(10) Patent No.: US 12,004,395 B2
(45) Date of Patent: Jun. 4, 2024

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Huatao Li, Beijing (CN); Zhiguang Zhang, Beijing (CN); Lei Feng, Beijing (CN); Jianhang Fu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 411 days.

(21) Appl. No.: 17/555,218

(22) Filed: Dec. 17, 2021

(65) Prior Publication Data
US 2022/0293710 A1 Sep. 15, 2022

(30) Foreign Application Priority Data

Mar. 12, 2021 (CN) .......................... 202110268422.7

(51) Int. Cl.
*H10K 59/131* (2023.01)
*H10K 59/35* (2023.01)
(52) U.S. Cl.
CPC ......... *H10K 59/131* (2023.02); *H10K 59/353* (2023.02)

(58) Field of Classification Search
CPC ...... H10K 59/131; H10K 59/88; H10K 59/35; H10K 59/1315; H10K 59/353; H10K 59/12; H10K 59/17; H10K 59/90; H05B 33/06; H05B 44/00; H05B 45/00; H05B 45/30; H05B 45/34; H05B 45/345; G09G 3/3225

See application file for complete search history.

(56) References Cited

U.S. PATENT DOCUMENTS

2018/0145278 A1* 5/2018 Zhai ........................ H10K 59/12

* cited by examiner

*Primary Examiner* — Anne M Hines
*Assistant Examiner* — Jose M Diaz
(74) *Attorney, Agent, or Firm* — IPro, PLLC

(57) ABSTRACT

A display substrate includes a plurality of pixel units arranged to form a plurality of pixel columns extending along a first direction, the display substrate further includes a plurality of groups of power source signal lines and pixel driving circuits located on the substrate, each group of power source signal lines includes a plurality of secondary signal lines, the pixel driving circuits of the pixel units in each pixel column are connected to different secondary signal lines in a same group of power source signal lines, each secondary signal line extends along the first direction from a starting end of the power source signal lines, extension lengths of the secondary signal lines in the same group of power source signal lines are different, and resistance values per unit length of different secondary signal lines along the first direction decrease as total lengths of the secondary signal lines increase.

20 Claims, 1 Drawing Sheet

DISPLAY SUBSTRATE AND DISPLAY DEVICE

CROSS-REFERENCE TO RELATED APPLICATIONS

This application claims a priority to Chinese Patent Application No. 202110268422.7 filed in China on Mar. 12, 2021, which is incorporated by reference herein in its entirety.

TECHNICAL FIELD

The present disclosure relates to the field of display technology, in particular to a display substrate and a display device.

BACKGROUND

Generally, a pixel unit of such self-luminescence display device as an OLED (Organic Light-Emitting Diode) includes a driving circuit and a light-emitting unit, the light-emitting unit is powered through a power source signal line located on a display substrate.

SUMMARY

In a first aspect, a display substrate is provided in the embodiments of the present disclosure, including a substrate and a plurality of pixel units located on the substrate. The pixel units are arranged to form a plurality of pixel columns extending along a first direction. The display substrate further includes a plurality of groups of power source signal lines and pixel driving circuits located on the substrate, each group of power source signal lines includes a plurality of secondary signal lines, the pixel driving circuits of the pixel units in each pixel column are connected to different secondary signal lines of a same group of power source signal lines, each secondary signal lines extends along the first direction from a starting end of the power source signal lines, extension lengths of the secondary signal lines in the same group of power source signal lines are different, and resistance values per unit length of different secondary signal lines along the first direction decrease as total lengths of the secondary signal lines increase.

Optionally, thicknesses of the secondary signal lines are identical, and widths of the secondary signal lines having different lengths are different, where a thickness of each secondary signal line is referred to as a size of each secondary signal line in a direction perpendicular to the substrate, a length of each secondary signal line is referred to as a size of each secondary signal line along the first direction, and a width of each secondary signal line is referred to as a size of each secondary signal line along a second direction parallel to the substrate and perpendicular to the first direction.

Optionally, at least one group of power source signal lines includes a first secondary signal line and a second secondary signal line, a length of the first secondary signal line is greater than a length of the second secondary signal line, and a width of the first secondary signal line is greater than a width of the second secondary signal line.

Optionally, each pixel unit includes a plurality of sub-pixels of different colors, the sub-pixels of different colors are respectively connected to different power source signal lines, both lengths and thicknesses of the secondary signal lines corresponding to the sub-pixels of different colors in a same pixel unit are the same, and the widths of the secondary signal lines corresponding to the sub-pixels of different colors in the same pixel unit are different, where a thickness of each secondary signal line is referred to as a size of each secondary signal line in a direction perpendicular to the substrate, a length of each secondary signal line is referred to as a size of each secondary signal line along the first direction, and a width of each secondary signal line is referred to as a size of each secondary signal line along a second direction parallel to the substrate and perpendicular to the first direction.

Optionally, the sub-pixel includes a green sub-pixel, a red sub-pixel and a blue sub-pixel, and widths of secondary signal lines respectively corresponding to the green sub-pixel, the red sub-pixel and the blue sub-pixel in the same pixel unit decrease gradually.

Optionally, a ratio of a width of a secondary signal line corresponding to the green sub-pixel to a width of a secondary signal line corresponding to the red sub-pixel to a width of a secondary signal line corresponding to the blue sub-pixel in the same pixel unit is (2.8-3.2):(0.9-1.1):(0.4-0.6).

Optionally, the ratio of the width of the secondary signal line corresponding to the green sub-pixel to the width of the secondary signal line corresponding to the red sub-pixel to the width of the secondary signal line corresponding to the blue sub-pixel in the same pixel unit is 3:1:0.5.

Optionally, the display substrate includes a first display area and a second display area, the second display area is located at one side of the first display area away from the starting end of the power source signal lines, and a length of each secondary signal line corresponding to a pixel unit in the second display area is greater than a length of each secondary signal line corresponding to a pixel unit in the first display area.

Optionally, the display substrate further includes a dummy electrode pattern insulated from the secondary signal lines, and each dummy electrode pattern extends from a terminal end of a corresponding secondary signal line to an edge of the display substrate along the first direction.

Optionally, the dummy electrode pattern is arranged at a same layer and made of a same material as the secondary signal lines.

In a second aspect, a display device is further provided in the embodiments of the present disclosure, including the display substrate as described in the first aspect.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Apparently, the following drawings merely relate to some embodiments of the present disclosure, and based on these drawings, a person of ordinary skill in the art may obtain other drawings without any creative effort.

DETAILED DESCRIPTION

The technical solutions in the embodiments of the present disclosure will be described hereinafter clearly and completely with reference to the drawings of the embodiments of the present disclosure. Apparently, the following embodiments merely relate to a part of, rather than all of, the embodiments of the present disclosure, and based on these embodiments, a person of ordinary skill in the art may, without any creative effort, obtain other embodiments, which also fall within the scope of the present disclosure.

Generally, a length of a power source signal line on the display substrate is relatively large, and an IR drop occurring in the voltage from the power source signal line increases along with an increase in an extension length of the power source signal line, which may adversely affect the brightness of different areas of the display device.

A display substrate and a display device are provided in the embodiments of the present disclosure, so as to address an issue that the IR drop of the power source signal line may adversely affect the display effect.

Figure 1:
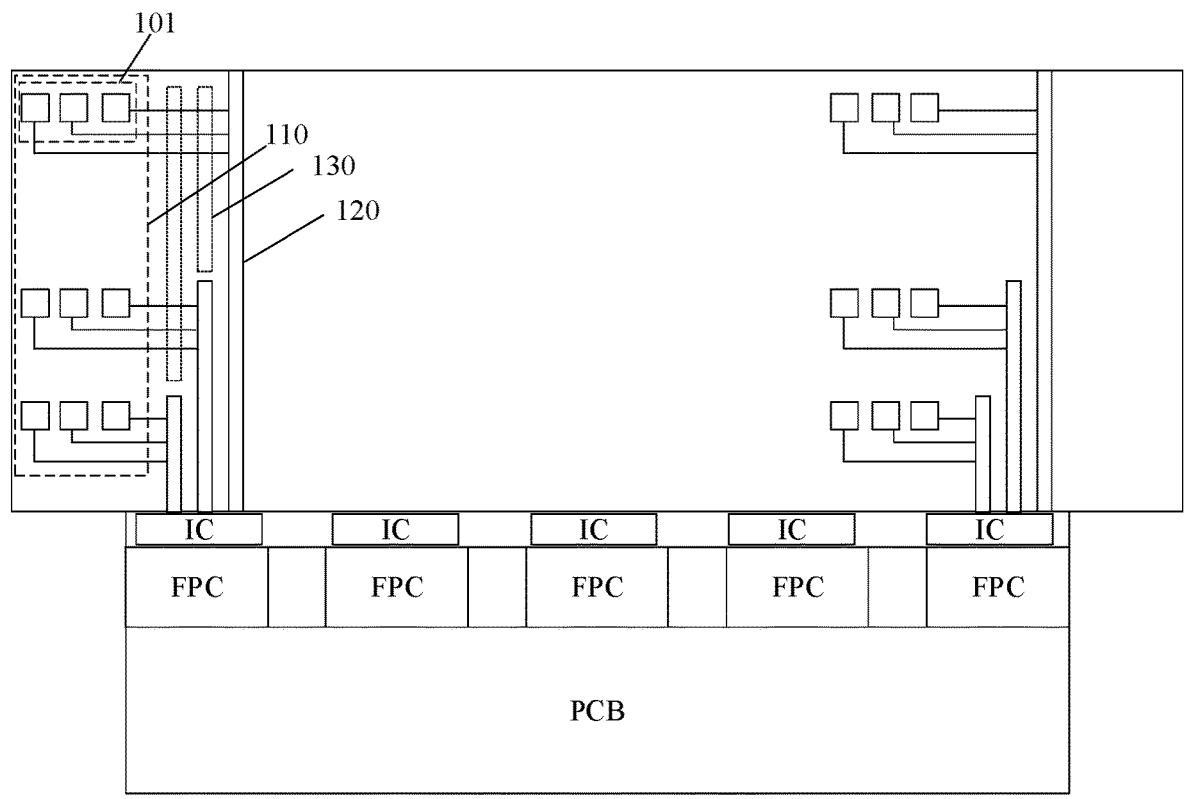
FIG. 1 is a schematic structural view showing a display substrate according to an embodiment of the present disclosure.

As shown in FIG. 1, in one embodiment, the display substrate includes a substrate and a plurality of pixel units 101 located on the substrate, and further includes a plurality of groups of power source signal lines and pixel driving circuits located on the substrate, and the pixel driving circuits are connected to the power source signal lines.

Each power source signal line in the display substrate is used to apply a driving voltage. In some embodiments, the display substrate needs to operate in cooperation with other structures such as a flexible printed circuit (FPC). Illustratively, the FPC is connected to the display substrate. The display substrate includes a display area (AA area), and the power source signal lines extend from the FPC to the display substrate and further extend from an end of the AA area close to the FPC to an end of the AA area away from the FPC.

As shown in FIG. 1, the pixel units 101 are arranged to form a plurality of pixel columns 110 extending along a first direction. In the embodiment, the first direction is referred to as a longitudinal direction in FIG. 1.

Each group of power source signal lines includes a plurality of secondary signal lines 120, the pixel driving circuits of the pixel units 101 in each pixel column 110 are connected to different secondary signal lines 120 in a same group of power source signal lines, each secondary signal line 120 extends along the first direction from a starting end of the power source signal lines, extension lengths of the secondary signal lines 120 in the same group of power source signal lines are different, and resistance values per unit length of different secondary signal lines along the first direction decrease as total lengths of the secondary signal lines increase.

For a same pixel column 110, the IR drop of a same power source signal line is different at different positions relative to the starting end, resulting in different power source voltages for different pixel units 101 in the same pixel column 110.

In the embodiment, the resistance values per unit length of different secondary signal lines 120 along the first direction decrease as the total lengths of the secondary signal lines 120 increase. In other words, the larger the length of the secondary signal line 120, the smaller the resistance value per unit length of the secondary signal line 120. In addition, the resistance value of each secondary signal line 120 increases along with an increase in the length. Thus, a difference value among the resistance values of the secondary signal lines 120 having different lengths is relatively low, and thereby a difference value among the voltage drop of the power source voltage from different secondary signal lines 120 decreases.

The resistance values per unit length of different secondary signal lines 120 along the first direction decrease as the total lengths of the secondary signal lines 120 increase, the difference value among the voltage drop of the secondary signal lines 120 having different lengths is relatively small, and it is able to reduce a voltage difference among the power source voltages applied to light-emitting units at different positions, so as to improve the brightness uniformity of the display substrate.

In some embodiments, thicknesses of the secondary signal lines 120 are identical, and widths of the secondary signal lines 120 having different lengths are different, where a thickness of each secondary signal line 120 is referred to as a size of each secondary signal line 120 in a direction perpendicular to the substrate, a length of each secondary signal line 120 is referred to as a size of each secondary signal line 120 along the first direction, and a width of each secondary signal line 120 is referred to as a size of each secondary signal line 120 along a second direction parallel to the substrate and perpendicular to the first direction.

In the embodiment, it is able to control the resistance value per unit length of the secondary signal line 120 through controlling the width and the thickness of the secondary signal line 120. It should be appreciated that, in the case that the secondary signal lines 120 having the same thickness are made of a same material, the larger the width of the secondary signal line 120, the smaller the resistance value per unit length.

In the embodiment, the secondary signal lines 120 may be formed by using a single patterning process, a thickness of a deposited material layer is uniform, and it is able to control line widths of different secondary signal lines 120 through controlling a shape of a mask in the patterning process during implementation, so as to control the resistance values of the different secondary signal lines 120.

Illustratively, in some embodiments, at least one group of power source signal lines includes a first secondary signal line and a second secondary signal line, a length of the first secondary signal line is greater than a length of the second secondary signal line, and a width of the first secondary signal line is greater than a width of the second secondary signal line.

It should be appreciated that the quantity of the secondary signal lines 120 in one group of power source signal lines may be increased, and the larger the length of the secondary signal line 120, the larger the width of the secondary signal line 120, so it is able to achieve a smaller difference among the resistance values of the secondary signal lines 120 having different lengths.

In some embodiments, each pixel unit 101 includes a plurality of sub-pixels of different colors, the sub-pixels of different colors are respectively connected to different power source signal lines, both lengths and thicknesses of the secondary signal lines corresponding to the sub-pixels of different colors in a same pixel unit are the same, and widths of the secondary signal lines 120 corresponding to the sub-pixels of different colors in the same pixel unit 101 are different.

It should be appreciated that, mixing ratios of the primary colors (i.e., red, green and blue) for forming white light are not identical, as a result, loads of the sub-pixels of different colors are different. Thus, operating currents thereof are also different, and the greater the load of the sub-pixel is, the greater the operating current corresponding to the sub-pixel is, and accordingly, the greater a voltage loss generated on the secondary signal line 120. In the embodiment, different sub-pixels in the same pixel unit 101 are connected to secondary signal lines 120 having the same length but different widths respectively, the greater the load of the secondary signal line 120 is, the greater the width of the secondary signal line 120 is, and the smaller the resistance thereof. In this way, although the operating current of the secondary signal line 120 of which the load is large is relatively large, the resistance value of the secondary signal line 120 is relatively small, it is able to ensure higher consistent voltage losses corresponding to the sub-pixels in different colors, so as to improve the display effect.

In some embodiments, the sub-pixels include a green sub-pixel, a red sub-pixel and a blue sub-pixel, and widths of the secondary signal lines 120 respectively corresponding to the green sub-pixel, the red sub-pixel, and the blue sub-pixel in the same pixel unit 101 decrease gradually.

It is found that loads of the green sub-pixel, the red sub-pixel and the blue sub-pixel decrease gradually, as a result, the widths of the secondary signal lines 120 respectively corresponding to the green sub-pixel, the red sub-pixel and the blue sub-pixel are controlled to decrease gradually.

More specifically, in some embodiments, a ratio of a width of a secondary signal line corresponding to the green sub-pixel to a width of a secondary signal line corresponding to the red sub-pixel to a width of a secondary signal line corresponding to the blue sub-pixel in the same pixel unit is (2.8-3.2):(0.9-1.1):(0.4-0.6). Further, in one embodiment, the ratio of the width of the secondary signal line corresponding to the green sub-pixel to the width of the secondary signal line corresponding to the red sub-pixel to the width of the secondary signal line corresponding to the blue sub-pixel in the same pixel unit is 3:1:0.5. Thus, it is able to improve the consistency of the power source voltages corresponding to the sub-pixels of different colors.

In this way, according to a current formula, i.e., I=k/2 (ELVDD−Vdata), and a current is in direct proportion to a brightness value of the sub-pixel, a difference among driving voltages for driving the sub-pixels of different colors is reduced, a difference among brightness values is reduced, and a brightness uniformity of the display substrate is improved.

In some embodiments, the display substrate includes a first display area and a second display area, the second display area is located at one side of the first display area away from the starting end of the power source signal line, and a length of each secondary signal line 120 corresponding to a pixel unit 101 in the second display area is greater than a length of each secondary signal line 120 corresponding to the pixel unit 101 in the first display area.

In the embodiment, the display substrate is divided into a plurality of display areas along the first direction, and lengths of the secondary signal lines corresponding to different display areas are different, so it is able to improve the consistency of the display effect.

In some embodiments, the display substrate further includes a dummy electrode pattern 130 insulated from the secondary signal lines 120, and each dummy electrode pattern 130 extends from a terminal end of a corresponding secondary signal line 120 to an edge of the display substrate along the first direction.

In the embodiment, the dummy electrode pattern 130 is arranged on the display substrate, and a position of the dummy electrode pattern 130 corresponds to a position of the corresponding secondary signal line 120. It should be appreciated that, in the first direction, the secondary signal line 120 and the dummy electrode pattern 130 are substantially located on a same straight line, and the length of the corresponding dummy electrode pattern 130 is small when the length of the corresponding secondary signal line 120 is large. In this way, it is able to provide the uniform thickness of the display substrate in different areas, so as to improve the display effect.

In some embodiments, the dummy electrode pattern 130 is arranged at a same layer and made of a same material as the secondary signal lines 120.

It should be appreciated that, when the dummy electrode pattern 130 and the secondary signal lines 120 are formed through one patterning process, it is able to save the process while improving the thickness uniformity of the display substrate.

A display device is further provided in the embodiments of the present disclosure, including the above-mentioned display substrate. Since the display device includes all the technical solutions of the above-mentioned display substrate embodiments, it is able to achieve at least all the above-mentioned technical effects, which will not be particularly defined herein.

Figure 2:
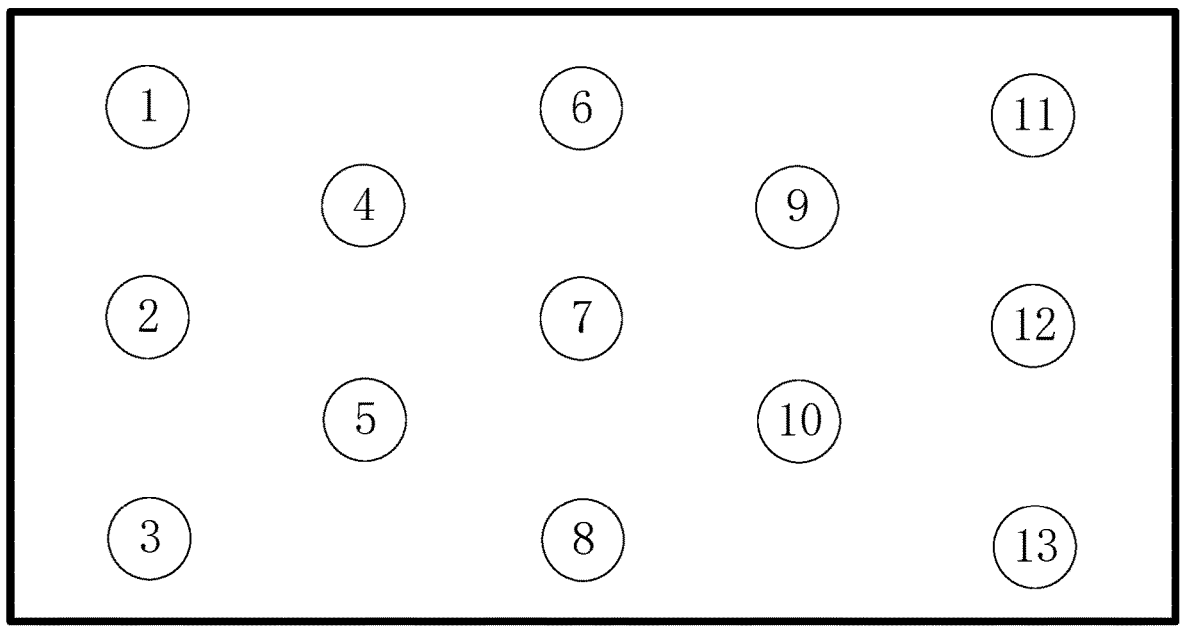
FIG. 2 is a schematic view showing sampling points for brightness detection according to an embodiment of the present disclosure.

As shown in FIG. 2, a plurality of sampling points may be arranged in the display area of the display device. In the embodiment, there are 13 sampling points in total from 1 to 13. Next, a brightness value of each sampling point is acquired, a maximum brightness value Lmax and a minimum brightness value Lmin are obtained, and a brightness uniformity of the display device is calculated through a formula, i.e., Uniformity=(Lmin/Lmax)*100%. Uniformity represents the brightness uniformity. It is found through testing that the brightness uniformity of the display device is significantly improved after applying the technical solution of the present application.

The above are merely specific embodiments of the present disclosure, but a protection scope of the present disclosure is not limited thereto. Any modifications or replacements that would easily occurred to a person skilled in the art, without departing from the technical scope disclosed in the disclosure, should be encompassed in the protection scope of the present disclosure. Therefore, the protection scope of the present disclosure shall be subject to the protection scope of the claims.

What is claimed is:

1. A display substrate, comprising a substrate and a plurality of pixel units located on the substrate, wherein the pixel units are arranged to form a plurality of pixel columns extending along a first direction, the display substrate further comprises a plurality of groups of power source signal lines and pixel driving circuits located on the substrate, each group of power source signal lines comprises a plurality of secondary signal lines, the pixel driving circuits of the pixel units in each pixel column are connected to different secondary signal lines in a same group of power source signal lines, each secondary signal line extends along the first direction from a starting end of the power source signal lines, extension lengths of the secondary signal lines in the same group of power source signal lines are different, and resistance values per unit length of different secondary signal lines along the first direction decrease as total lengths of the secondary signal lines increase.

2. The display substrate according to claim 1, wherein thicknesses of the secondary signal lines are identical, and widths of the secondary signal lines having different lengths are different, wherein a thickness of each secondary signal line is referred to as a size of each secondary signal line in a direction perpendicular to the substrate, a length of each secondary signal line is referred to as a size of each secondary signal line along the first direction, and a width of each secondary signal line is referred to as a size of each secondary signal line along a second direction parallel to the substrate and perpendicular to the first direction.

3. The display substrate according to claim 2, wherein at least one group of power source signal lines comprises a first secondary signal line and a second secondary signal line, a length of the first secondary signal line is greater than a length of the second secondary signal line, and a width of the first secondary signal line is greater than a width of the second secondary signal line.

4. The display substrate according to claim 1, wherein each pixel unit comprises a plurality of sub-pixels of different colors, the sub-pixels of different colors are respectively connected to different power source signal lines, both lengths and thicknesses of the secondary signal lines corresponding to the sub-pixels of different colors in a same pixel unit are the same, and widths of the secondary signal lines corresponding to the sub-pixels of different colors in the same pixel unit are different, wherein a thickness of each secondary signal line is referred to as a size of each secondary signal line in a direction perpendicular to the substrate, a length of each secondary signal line is referred to as a size of each secondary signal line along the first direction, and a width of each secondary signal line is referred to as a size of each secondary signal line along a second direction parallel to the substrate and perpendicular to the first direction.

5. The display substrate according to claim 4, wherein the sub-pixels comprise a green sub-pixel, a red sub-pixel and a blue sub-pixel, and widths of secondary signal lines respectively corresponding to the green sub-pixel, the red sub-pixel and the blue sub-pixel in the same pixel unit decrease gradually.

6. The display substrate according to claim 4, wherein a ratio of a width of a secondary signal line corresponding to the green sub-pixel to a width of a secondary signal line corresponding to the red sub-pixel to a width of a secondary signal line corresponding to the blue sub-pixel in the same pixel unit is (2.8-3.2):(0.9-1.1):(0.4-0.6).

7. The display substrate according to claim 6, wherein the ratio of the width of the secondary signal line corresponding to the green sub-pixel to the width of the secondary signal line corresponding to the red sub-pixel to the width of the secondary signal line corresponding to the blue sub-pixel in the same pixel unit is 3:1:0.5.

8. The display substrate according to claim 2, wherein the display substrate comprises a first display area and a second display area, the second display area is located at one side of the first display area away from the starting end of the power source signal lines, and a length of each secondary signal line corresponding to a pixel unit in the second display area is greater than a length of each secondary signal line corresponding to a pixel unit in the first display area.

9. The display substrate according to claim 1, further comprising a dummy electrode pattern insulated from the secondary signal lines, and each dummy electrode pattern extends from a terminal end of a corresponding secondary signal line to an edge of the display substrate along the first direction.

10. The display substrate according to claim 9, wherein the dummy electrode pattern is arranged at a same layer and made of a same material as the secondary signal lines.

11. A display device, comprising a display substrate, wherein the display substrate comprises a substrate and a plurality of pixel units located on the substrate, the pixel units are arranged to form a plurality of pixel columns extending along a first direction, the display substrate further comprises a plurality of groups of power source signal lines and pixel driving circuits located on the substrate, each group of power source signal lines comprises a plurality of secondary signal lines, the pixel driving circuits of the pixel units in each pixel column are connected to different secondary signal lines in a same group of power source signal lines, each secondary signal line extends along the first direction from a starting end of the power source signal lines, extension lengths of the secondary signal lines in the same group of power source signal lines are different, and resistance values per unit length of different secondary signal lines along the first direction decrease as total lengths of the secondary signal lines increase.

12. The display device according to claim 11, wherein thicknesses of the secondary signal lines are identical, and widths of the secondary signal lines having different lengths are different, wherein a thickness of each secondary signal line is referred to as a size of each secondary signal line in a direction perpendicular to the substrate, a length of each secondary signal line is referred to as a size of each secondary signal line along the first direction, and a width of each secondary signal line is referred to as a size of each secondary signal line along a second direction parallel to the substrate and perpendicular to the first direction.

13. The display device according to claim 12, wherein at least one group of power source signal lines comprises a first secondary signal line and a second secondary signal line, a length of the first secondary signal line is greater than a length of the second secondary signal line, and a width of the first secondary signal line is greater than a width of the second secondary signal line.

14. The display device according to claim 11, wherein each pixel unit comprises a plurality of sub-pixels of different colors, the sub-pixels of different colors are respectively connected to different power source signal lines, both lengths and thicknesses of the secondary signal lines corresponding to the sub-pixels of different colors in a same pixel unit are the same, and the widths of the secondary signal lines corresponding to the sub-pixels of different colors in the same pixel unit are different, wherein a thickness of each secondary signal line is referred to as a size of each secondary signal line in a direction perpendicular to the substrate, a length of each secondary signal line is referred to as a size of each secondary signal line along the first direction, and a width of each secondary signal line is referred to as a size of each secondary signal line along a second direction parallel to the substrate and perpendicular to the first direction.

15. The display device according to claim 14, wherein the sub-pixels comprise a green sub-pixel, a red sub-pixel and a blue sub-pixel, and widths of secondary signal lines respectively corresponding to the green sub-pixel, the red sub-pixel and the blue sub-pixel in the same pixel unit decrease gradually.

16. The display device according to claim 14, wherein a ratio of a width of a secondary signal line corresponding to the green sub-pixel to a width of a secondary signal line corresponding to the red sub-pixel to a width of a secondary signal line corresponding to the blue sub-pixel in the same pixel unit is (2.8-3.2):(0.9-1.1):(0.4-0.6).

17. The display device according to claim 16, wherein the ratio of the width of the secondary signal line corresponding to the green sub-pixel to the width of the secondary signal line corresponding to the red sub-pixel to the width of the secondary signal line corresponding to the blue sub-pixel in the same pixel unit is 3:1:0.5.

18. The display device according to claim 12, wherein the display substrate comprises a first display area and a second display area, the second display area is located at one side of the first display area away from the starting end of the power source signal lines, and a length of each secondary signal line corresponding to a pixel unit in the second display area is greater than a length of each secondary signal line corresponding to a pixel unit in the first display area.

19. The display device according to claim 11, wherein the display substrate further comprises a dummy electrode pattern insulated from the secondary signal lines, and each dummy electrode pattern extends from a terminal end of a corresponding secondary signal line to an edge of the display substrate along the first direction.

20. The display substrate according to claim 19, wherein the dummy electrode pattern is arranged at a same layer and made of a same material as the secondary signal lines.

\* \* \* \* \*